(12) United States Patent
Vasic et al.

(10) Patent No.: US 6,587,987 B1
(45) Date of Patent: Jul. 1, 2003

(54) METHOD AND APPARATUS FOR EXTRACTING RELIABILITY INFORMATION FROM PARTIAL RESPONSE CHANNELS

(75) Inventors: Bane V. Vasic, Allentown, PA (US); Inkyu Lee, Kearny, NJ (US); Jeffrey L. Sonntag, Allentown, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 344 days.

(21) Appl. No.: 09/611,887

(22) Filed: Jul. 7, 2000

(51) Int. Cl.$^7$ .............................................. H03M 13/00
(52) U.S. Cl. ...................................................... 714/780
(58) Field of Search ................................ 714/779, 780, 714/786, 794, 795, 791, 792, 755, 756, 758; 375/240.27, 263, 262, 265, 341; 708/530, 315, 420, 813

(56) References Cited

U.S. PATENT DOCUMENTS

| | | | | |
|---|---|---|---|---|
| 5,511,081 A | * | 4/1996 | Hagenauer ................... | 714/788 |
| 5,657,354 A | * | 8/1997 | Thesling et al. ............. | 375/280 |
| 5,914,989 A | * | 6/1999 | Thapar et al. ............... | 375/341 |
| 6,029,264 A | | 2/2000 | Kobayashi et al. .......... | 714/755 |
| 6,035,435 A | * | 3/2000 | Shih et al. ................... | 341/59 |
| 6,421,804 B1 | * | 7/2002 | Lee ............................. | 714/755 |

OTHER PUBLICATIONS

Lin & Costello, "Error Control Coding, Fundamentalsand Applications," pp. 1–14, Prentice Hall (1983).

Siegel & Wolf, "Modulation and coding for Information Storage," IEEE Communications Magazine, pp. 68–89 (Dec. 1991).

Kobayashi & Tang, "Application of Partial Response Channel Coding to Magnetic Recording Systems," IBM J. Res. and Dev., vol. 14, pp. 368–375 (Jul. 1970).

Forney, "Maximum Likelihood Sequence Estimation of Digital Sequence in the Presence of Intersymbol Interference," IEEE Trans. Inform. Theory, pp. 363–378 (Jul. 1979).

Barbosa, "Maximum Likelihood Sequence Estimators: A Geometric View," IEEE Trans. Inform. Theory, vol. IT–35, pp. 419–427 (Mar. 1989).

Altehar et al., "Error–Event Characterization Partial–Response Channels," IEEE Trans. Inform. Theory, vol. 45(1), pp. 241–247 (Jan. 1999).

Marcus et al., "Finite–state Modulation Codes for Data Storage," IEEE J. on Select. Areas in Commun., vol. 10(1), pp. 5–37, (1992).

* cited by examiner

Primary Examiner—Christine T. Tu

(57) ABSTRACT

The present invention is a method and system for generating soft outputs by taking advantage of the fact that, in PR channels, there exists a set of error event sequences that occurs more often than others. This results in a soft output extractor with significantly lower complexity than the prior art SOVA system. Minimum distance error event sequences are identified and soft information or bit reliabilities are extracted from the PR channel based on the identified sequences. The soft information is then used by an iterative error control decoder correct errors more efficiently.

19 Claims, 9 Drawing Sheets

FIG. 5

| TIME | n-6 | n-5 | n-4 | n-3 | n-2 | n-1 | n | n+1 | n+2 | n+3 | n+4 | n+5 | n+6 | n+7 | n+8 |
|---|---|---|---|---|---|---|---|---|---|---|---|---|---|---|---|
| DECISIONS | 0 | 0 | 1 | 0 | 1 | 0 | 1 | 0 | 1 | 0 | 1 | 0 | 0 | 0 | 0 |
| ERROR$_1$ (7) | | | | | | | + | | | | | | | | |
| ERROR$_2$ (3) | | | | | | − | + | | | | | | | | |
| ERROR$_3$ (8) | | | | | | − | + | − | | | | | | | |
| ERROR$_4$ (10) | | | | | + | − | + | − | + | | | | | | |
| ERROR$_5$ (20) | | | | | | | + | | | | | | | | |
| ERROR$_6$ (30) | | | | | | − | + | − | | | | | | | |
| ERROR$_7$ (40) | | | | | + | 0 | + | | + | | | | | | |
| ERROR$_8$ (50) | | | | | | | + | 0 | | | | | | | |

METHOD AND APPARATUS FOR EXTRACTING RELIABILITY INFORMATION FROM PARTIAL RESPONSE CHANNELS

FIELD OF THE INVENTION

This invention relates to a method and apparatus for extracting reliability information from partial response channels, and more particularly, to the extraction of soft information from partial response channels by using a dominant error event list.

BACKGROUND OF THE INVENTION

Digital transmission and recording systems convey discrete-time data sequences across channels using signals which are variable in nature. A primary goal of any such system is to convey information at the fastest possible rate with a minimum number of errors. Accordingly, numerous approaches for error control have been developed to try to minimize and/or correct errors in transmitted signals, as illustrated in U.S. Pat. No. 6,029,264 to Kobayashi et al.; and "Error Control Coding, Fundamentals and Applications," by S. Lin and D. Costello, Jr., Pages 1–14, Prentice Hall, 1983; both of which are incorporated herein fully by reference.

A data sequence having a bit interval T and comprising, for example, a series of bits which change in amplitude (e.g., a change from a positive-amplitude bit +A to a negative-amplitude bit −A or vice versa) and/or which remain unchanged (e.g., no change in state of a data bit from one pulse to the next) with the occurrence of each bit interval T is transmitted as a sequence of analog pulses each of a certain duration equal to the bit interval T. FIG. 1 illustrates an example of an input data sequence 1, 1, −1 (identified respectively as pulses 102, 104, and 106) and the corresponding transmitted output sequence, identified by the dotted line 210. In this example, a "1" indicates a positive-amplitude bit +A and a "−1" indicates a negative-amplitude pulse −A. As can be seen in FIG. 1, the pulses of the transmitted output sequence have rounded edges as compared to the square edges of the input data sequence 102, 104, and 106.

Despite the somewhat imprecise correlation between the input data sequence 102, 104, 106 and the transmitted output data sequence 210 of FIG. 1, the different pulses are distinguishable from each other nonetheless, using a well-known technique referred to as "sequence detection." Even if the signal is corrupted by noise, the detection of each bit is accomplished by sampling and storing the value of each bit at the point P in time, corresponding to the peak value X of the transmitted signal. The bit being sampled at a time P(n) is referred to herein as the "present is sample" or "present bit." By comparing the value of the present sample with the value of the samples immediately preceding the present sample in the data sequence (e.g., the samples taken at time P(n−1), P(n−2), P(n−3), . . . P(n−M+1), where M is the channel memory, i.e., the number of previous samples that influence the present sample) it can be determined if a change in amplitude has occurred. When the present sample is being compared or is otherwise under scrutiny, it is also known as the "bit of interest."

Although sequence detection offers a reasonable method of error control, a problem occurs when the overall data rate is increased, since the bit intervals T overlap as the total time t is shortened to accommodate the additional data to be transmitted. FIG. 2 illustrates a situation in which the data rate for the data sequence of FIG. 1 is increased. As shown in FIG. 2, a second bit 204 is transmitted before the transmission of first bit 202 has been completed. Since the bits overlap, the combined pulse, obtained by superposition of the overlapping pulses, results in a wave shape that does not allow the first pulse and the second pulse to be easily distinguished from each other. The combined pulse wave form is identified in FIG. 2 as dotted line 210.

This complicated wave form 210 is created because the present sample sampled at time n at the peak value X contains not only the value of pulse 204 at time n but also includes the "tail" of previous pulse 202. This effect is known as inter-symbol interference, or ISI. Base-band communication systems transmit data at a high rate (e.g. 1000 Mb/s) in comparison to data transmission using the channel frequency band (e.g. 500 MHz). This high rate of data transmission can result in severe ISI.

If the pulses have short tails, the ISI is limited, since at some time interval (i.e., at the point at which the prior pulse has been completely transmitted) a previous pulse will no longer affect the value of the present sample. From the standpoint of detection, it is desirable that the samples of the signal tail be limited to a finite number of integer values to reduce the number of comparisons that must be made. Systems utilizing this property are called "partial response" (PR) systems. Examples of such systems are described in, for example, "Modulation and Coding for Information Storage" by P. Siegel and J. Wolf, IEEE Communications Magazine, pp. 68–89, December 1991; and "Application of Partial Response Channel Coding to Magnetic Recording Systems," by H. Kobayashi and D. Tang, IBM J. Res. and Dev, vol. 14, pp. 368–375, July 1997, both of which are incorporated fully herein by reference.

The above-mentioned sequence detection technique is commonly used to detect the presence of ISI in a sampled signal. According to this technique, a sequence detector is employed to detect and identify transmitted (or, in the case of magnetic recording, recorded) sequences of pulses which are more likely to be incorrectly transmitted, using knowledge of noise statistics and knowledge of the channel configuration (e.g., the dependence of noise samples on previous noise samples; noise power; and/or partial response polynomials). A common noise model is called Additive White Gaussian Noise (AWGN), and a common channel model is linear time-invariant channel.

A maximum-likelihood sequence detector (MLSD) is a known sequence detector used for an uncoded, linear ISI channel (a channel which is transmitting pulses that are close together and thus having pulses which interfere with each other) with additive Gaussian noise. An example of an MLSD is described in an article entitled "Maximum Likelihood Sequence Detection in the Presence of Intersymbol Interference" by G. D. Forney (IEEE Trans. Inform. Theory, Vol. IT-25, pp. 332–335, May 1979), incorporated fully herein by reference.

A MLSD comprises a whitened matched filter (WMF), having an output that is sampled at the pulse rate of the input signal. The sampled output is input to a Viterbi detector having a trellis structure which reflects the data sequence transmitted over the ISI channel and detects the data. MLSD is not practical, particularly for communication and recording systems, because the structure of the MLSD is prohibitively complex to implement, requiring an unlimited number of states in the Viterbi detector, i.e., the hardware required to implement it is very complex.

PR systems utilize equalization to deal with ISI-related errors. Equalization is the process of reducing distortion over transmission paths by inserting compensation devices, e.g., amplifiers, in the transmission path. Placing an equalizer on the front end of a receiver receiving the transmitted data sequence allows ISI to be reduced and controlled, or even eliminated altogether. A detailed explanation of equalization is provided in the previously-cited article by P. Siegel and J. Wolf.

Complete elimination of ISI using equalization can be accomplished only in older, less sophisticated recording channel systems with low data rates, or in recording systems having low recording densities where the pulses are far enough apart to avoid ISI. In PR systems, a data sequence is reconstructed from a suitably equalized received (readback) signal, without whitened filtering, using a Viterbi detector. The noiseless equalizer output sample resulting from the use of this approach is affected by only a finite number of previous input (transmitted or recorded) samples; thus, the set of equalizer output values has set boundaries.

The well-known Viterbi algorithm used by Viterbi detectors is relatively simple, making it a good choice for use in an uncoded communication system where soft-output (i.e., reliability-checking) is not required. However, in many applications, the data transmitted over channels is encoded to improve the overall error performance of the system. Soft-output is required in (a) concatenated systems having a pair of codes (inner and outer code), wherein the inner code generates soft outputs to improve the performance of the outer code, and (b) iterative decoding schemes where a decoder "purifies" its decisions about certain code symbols through a series of operations performed on a whole codeword (i.e., after each iteration there are less errors in the code word).

One of the most commonly-used algorithms for sequence detection is Hagenauer's soft-output-Viterbi-algorithm (SOVA) used in concatenation with some outer code such as a Reed Solomon code. The soft output at a particular time instant, produced by SOVA, is determined on the basis of the Euclidean distance between the two "best" paths that merge to the same state. This merging of states is based on the well-known concept of "channel trellis." Trellis describes all possible data sequences that can occur at the output of the channel as a result of the input. The state of the trellis is defined by certain of the channel outputs, and the path through the trellis is called the output sequence. Two paths are considered to be merged if the corresponding output sequences are different when they are input but at some point become the same.

The merged paths are then compared and a smaller level of reliability (i.e., a lower level of confidence in the accuracy of the data sequence being considered) is assigned to bits that do not agree. The procedure is repeated for all channel (or trellis) states. The VA decision on a particular bit together with its reliability level is referred to as soft output or soft information. According to the SOVA method of the prior art, the comparison procedure must be performed for all possible merged path pairs, and for all states, or equivalently for all possible error event sequences.

FIG. 3 is a block diagram depicting a prior-art PR channel system comprising an encoder 310, a partial response channel 320, a Viterbi detector 330, and a decoder 340. Only the digital portion of the transmission system is illustrated; modulators, demodulators, filters and all other analog blocks are not the focus of this invention and are thus omitted from FIG. 3.

In the system of FIG. 3, encoder 310 translates a data sequence $\{a^{(k)}\}$ to a sequence $\{d^{(k)}\}$ in such a way that sequence $\{a^{(k)}\}$ can be uniquely reconstructed from sequence $\{d^{(k)}\}$ to minimize transmission errors. This can be accomplished, for example, by adding parity bits to make sure that the code words cannot be confused with each other. In a known manner using control codes, sequence $\{a^{(k)}\}$ can be reconstructed even when some symbols of the translated sequence $\{d^{(k)}\}$ are corrupted by errors during the transmission of the signal to encoder 310. For the purpose of explanation it is assumed that the $a^{(k)}$ data sequence is binary e.g., $(a^{(k)})\in\{0,1\}$, where a "0" is an indication of a negative pulse and a "1" is indicative of a positive pulse. Typically, decoder 340 will use estimates of transmitted data $x^{(k)}$ (called hard decisions) output from Viterbi detector 330 to correct errors; however, some types of decoders, such as an iterative decoder, can improve decoding performances using soft decisions instead of hard decisions. This means that instead of using only the output $x^{(k)}$ (also called the "Viterbi estimate" or "Viterbi decision") from the Viterbi detector 330, decoder 340 also requires knowledge of the reliability of the specific value of $x^{(k)}$. The Viterbi estimate $x^{(k)}$ together with its reliability creates a soft decision.

Due to noise and other disturbances, the Viterbi estimate $\{x^{(k)}\}$ of the transmitted stream and the transmitted stream itself $\{d^{(k)}\}$ often differ. Their difference is called an error sequence $\{\epsilon^{(k)}\}$, where $\{\epsilon^{(k)}\}=x^{(k)}-d^{(k)}$. For good channels, i.e., channels with low noise power and which have a small number of errors, the error sequence is zero almost everywhere, but when the error sequence is nonzero, it can be observed that some error patterns occur much more often than others. Although any error pattern is possible, these more frequent error patterns dominate overall system performance. A recognition and explanation of the phenomenon of recurring error sequences, which is inherent for all PR systems, can be found in "Maximum Likelihood Sequence Estimators: a Geometric View" by L. Barbosa, IEEE Trans. Inform. Theory, vol. It-35, pp. 419–427, March 1989, incorporated fully herein by reference. Simply described, the Euclidean distance from channel output sequences corresponding to a sequence $\{d^{(k)}\}$ to the channel output sequence corresponding to $\{d^{(k)}-\epsilon^{(k)}\}$, where $\{\epsilon^{(k)}\}$ is one of the dominant (more frequently occurring) error sequences, will always be smaller than the distance to any other error sequence, and this is why the Viterbi detector (which in fact uses Eucledian metric) confuses them. This is also why dominant error patterns are called minimum distance error event sequences.

A method of finding dominant error event sequences is described in "Error-Event Characterization on Partial-Response Channels" by S. Altekar. M. Berggren, B. Moision, P. Siegel, and J. Wolf, IEEE Trans. Inform. Theory, vol. 45, no. 1, pp. 241–247, Jan. 1999, incorporated fully herein by reference. In recording systems, for a given partial response polynomial, the set of dominant error event sequences depends also on the channel bit density (e.g., the number of pulses transmitted per bit interval) because of noise coloration due to equalization. Other methods for determining dominant error event sequences are also known. See, for example, "Application of Partial Response Channel Coding to Magnetic Recording Systems" by H. Kobayashi and D. Tang, IBM J. Res. And Dev., vol. 14, pp. 368–375, July 1979 and "Finite-state Modulation Codes for Data Storage" by B. Marcus, P. Siegel, and J. Wolf, IEEE Journal on Select. Areas in Commun., vol. 10, no. 1, pp5–37, January 1992, both of which are fully incorporated herein by reference. However, as noted above, prior art systems require that each sample in a data sequence (e.g., all samples taken previously at times P(n−1), P(n−2), . . . , P(n−$S_{min}$) as well as all samples to be taken in the future at times P(n+1), P(n+2), . . . , P(n+$S_{max}$) be considered when evaluating the accuracy of the present sample taken at time P(n). This results in a slow and complex procedure and requires large amounts of memory to store each and every sample.

Thus, while it is known that certain error event sequences occur more frequently than others, it would be desirable to have a method and system for generating soft outputs which can quickly and simply determine the accuracy of a sampled data sequence and which can accomplish these goals with a minimum storage requirement.

SUMMARY OF THE INVENTION

The present invention is a method of generating soft outputs by taking advantage of the fact that, in PR channels, there exists a set of error event sequences that occur more often than others. This results in a soft output extractor with significantly lower complexity than the prior art SOVA system. Minimum distance error event sequences are identified and soft information or bit reliabilities of the error event bits making up the error event sequences (as contrasted to reliabilities of the overall error event sequence) are extracted from the PR channel based on the identified sequences. The soft information is then used by an iterative error control decoder to correct errors more efficiently.

In contrast to SOVA where soft information is generated by a modified Viterbi detector, in the present invention the soft information extraction takes place after the Viterbi detector. The present invention calculates the likelihood of the occurrence of error event sequences and converts the error event likelihoods to bit likelihood ratios. A "bit likelihood ratio" is defined as the ratio of (a) the probability that a certain bit is transmitted correctly (i.e., is the same before and after the Viterbi detector) and (b) the probability that it was not transmitted correctly.

One aspect of the present is a method of extracting reliability information for a bit of interest in a group of bits comprising a data sequence on a partial response channel, comprising the steps of (a) calculating error event likelihoods with respect to a data sequence on said partial response channel; and (b) deriving a bit likelihood ratio for the bit of interest from said error event likelihood values The present invention may be embodied in an algorithm for generating soft outputs for PR channels by using a property of PR channels that there exists a set of error event sequences that occur more often than others.

In another embodiment, the calculating step includes atleast the steps of: compiling a first error event set comprising error event sequences; selecting, from the first error event set, a second error event set comprising error event sequences which affect the bit of interest; and determining the error event likelihood value of each error event sequence of the second error event set.

In a further embodiment, the deriving step includes at least the steps of: determining which of the error event likelihood values indicates an error event having the highest probability of occurring; and assigning to the bit of interest a bit likelihood value corresponding to the error event likelihood value for the error event determined to have the highest probability of occurring.

In yet another embodiment, the error event sequences each comprise one or more error event bits, with each error event bit having a bit likelihood value, and the method further includes the steps of: determining the bit likelihood value of each error event bit associated with a particular error event sequence in the second error event set; and changing the bit likelihood value of each error event bit having a bit likelihood value greater than the error event likelihood value of its associated error event sequence, to equal the error event likelihood value of its associated error event sequence.

Further features and advantages of the present invention, as well as the structure and operation of various embodiments of the present invention, are described in detail below with reference to the accompanying drawings.

BRIEF DESCRIPTION OF THE DRAWINGS

FIG. 5 is a table showing an example of error sequences output from a Viterbi decorder;

DETAILED DESCRIPTION OF THE PREFERRED EMBODIMENTS

The present invention relates to PR systems, i.e. systems with controlled ISI. In the discussion that follows, the following definitions apply:

Error Event Bit:—An Error Event Bit is a single bit indicating the status (either as an error or a non-error) of a bit output, or potentially output, from a Viterbi detector and the type (either a "1" being output as a "0" or a "0" being output as a "1") of error associated with that particular output. Examples of error event bits are shown in FIG. 5 herein, e.g., in the sequence {+−+} corresponding to "$Error_4$" in FIG. 5, three error even bits are illustrated: a "+" with respect to the output at time n−2; a "−" with respect to the output at time n−1; and a "+" with respect to the output at time n.

Error Event Sequence—An Error Event Sequence is a series of error event bits that occur or tend to occur in sequence, one right after the other. Examples of error event sequence are shown in FIG. 5 herein, e.g., the sequence {+−+} corresponding to "$Error_4$" in FIG. 5 is an example of an error event sequence comprising error event bits +, −, and +.

Bit Likelihood Ratio—The Bit Likelihood Ratio, sometimes referred to as the "bit likelihood", is the ratio of A/B, where A is the probability that a particular bit detected/output by the Viterbi detector is the same as the bit input to the channel (NO ERROR, i.e., the bit was transmitted correctly) and B is the probability that a particular bit detected by the Viterbi detector is not the same as the bit input to the channel (ERROR, i.e., the bit was not transmitted correctly).

Bit Reliability Information—Bit Reliability Information, also referred to as "reliability information" or "bit reliability", is a value, calculated from the bit likelihood ratio, that indicates the likelihood (HIGH or LOW) that a bit detected at an output by a Viterbi detector is the same as the corresponding bit input to the channel. If the detected/output bit is the same as the input bit, it is considered accurate (NO ERROR) and if the detected/output bit is not the same as the input bit, it is considered inaccurate (ERROR). Thus, similar to the bit likelihood ratio, the bit reliability information is also a value which expresses the probability or likelihood that the detected/output bit is the same as the input bit. The bit reliability information is a logarithm of the bit likelihood ratio discussed above, i.e., a logarithm of A/B.

Error Event Likelihood Ratio—The Error Event Likelihood Ratio is a measure of confidence that a certain error event sequence occurred. An error event likelihood ratio, in the present invention, is expressed as a "lambda value". An error event sequence having a small lambda value (i.e., a small error event likelihood ratio) is an error event sequence that is more likely to occur; conversely, an error event sequence having a high lambda value is an error event sequencethat is less likely to occur.

Figure 1:
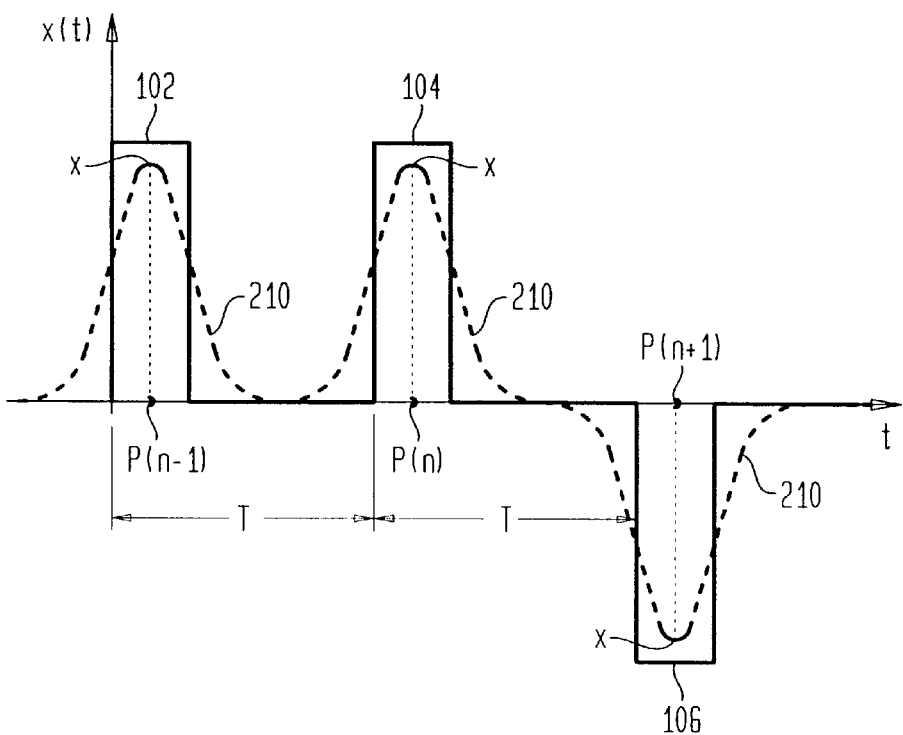
FIG. 1 illustrates an example of an input data sequence and the corresponding transmitted output sequence in a digital transmission recording system.
Figure 2:
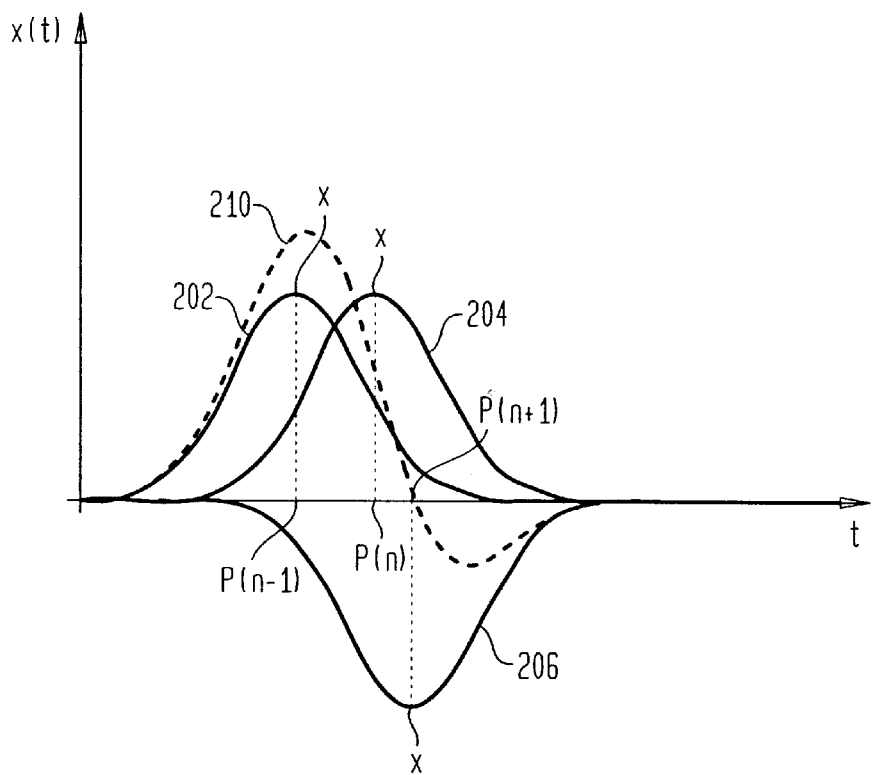
FIG. 2 illustrates an example of an input data sequence and the corresponding transmitted output sequence for a digital transmission recording system in which the data rate is increased as compared with the example of FIG. 1.
Figure 3:
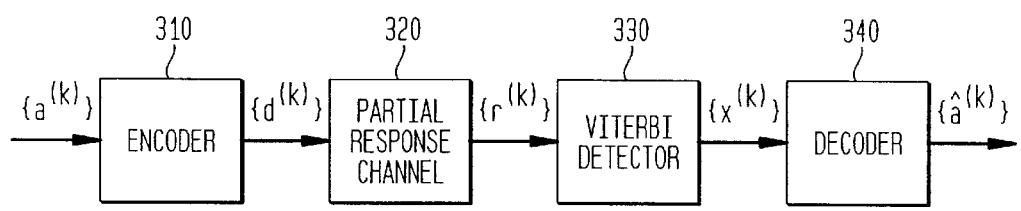
FIG. 3 is a block diagram depicting a prior art partial response channel system.
Figure 4:
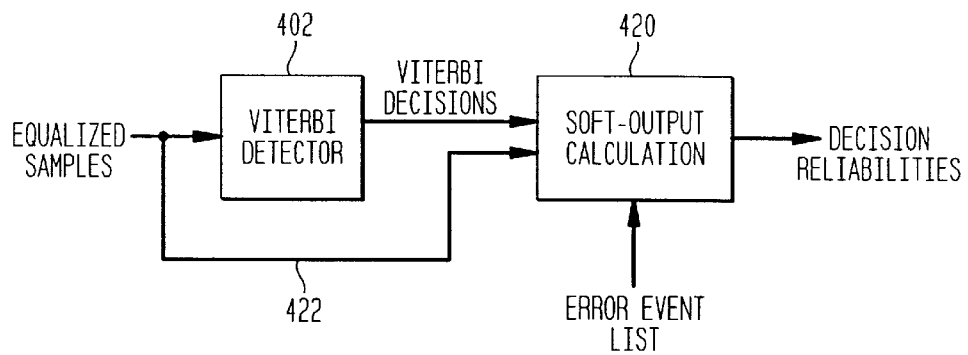
FIG. 4 is a block diagram illustrating the basic elements of the present invention.

FIG. 4 illustrates a block diagram of the basic elements of the present invention. The equalized output (a set of equalized samples) from an equalizer of the PR system (not shown) is input to a Viterbi detector 402 and to soft-output calculation block via path 422. Detector 402, in a known manner, analyzes the equalized samples using the Viterbi algorithm and produces and outputs a sequence of Viterbi decisions (estimates of the bits of the equalized samples) to soft-output calculation block 420.

An error event list is compiled (discussed more fully below) which identifies the error event sequences that are most likely to be output by the Viterbi detector incorrectly using known techniques. Soft-output calculation block 420, in addition to receiving the Viterbi estimate from Viterbi detector 402 and the list of more-frequently occurring error event sequence from the error event list, also, in accordance with the present invention, receives the equalized samples via bypass 422. Using all three of these inputs, the soft-output calculation block 420 produces the reliabilities of the Viterbi decisions.

The present invention exploits the property of PR channels that they produce certain types of error event sequences more frequently than others. Using this property, in accordance with the present invention, the reliability of the Viterbi decisions (i.e., the reliability of an individual bit output by the Viterbi detector) is calculated, and based on the results of this calculation, the outer decoder (e.g., an iterative decoder) can be used. The iterative decoder improves system performance by correcting errors that are not corrected by the Viterbi detector.

In accordance with the present invention, in order to calculate the reliability of the individual Viterbi decisions, it is necessary to first calculate the likelihood of the occurrence of typical error event sequences. For purpose of explanation, consider a binary transmission where the data bits can take on one of two values, either a positive amplitude +A (e.g., a positive 1) or a negative amplitude −A (e.g., a negative 1). Presume further that, as described above, when the Viterbi detector detects no change in amplitude from one bit to the next, it outputs a "0", and when it detects a change in amplitude it outputs a 1. In addition, presume that the Viterbi detector detects a stream comprising the bit sequence {0 0 1 0 1 0 1 0 1 0 0 0 0}. Presume further that it is desired to calculate the reliability of the "decision" by the Viterbi detector that the third "1" in this bit sequence is, in fact, a 1. For purposes of this example, the time instant corresponding to the third 1 is denoted by n indicating that it is considered to be the "present sample."

The most precise method of calculating the reliability of the third bit would involve considering all possible error event sequences that might occur, determining their likelihood of occurring, and then applying this information to the data stream. However, the possible number of error event sequences is enormous since there are 15 bits in the example data stream and checking each and every sequence of error event bits is prohibitive. Using the technique of the present invention, it is not necessary to check for the occurrence of each and every error. Since many of the possible error event sequences occur extremely infrequently, they can be considered statistically irrelevant and excluding them from consideration does not substantially affect the reliability estimate.

Consider the table in FIG. 5, which is a table showing an example of error event sequences which have been determined to be the most likely error event sequences to occur with respect to a sequence of bits ("decisions") output from a Viterbi detector. In the table of FIG. 5, a "+" indicates an error event in which a zero is detected as a one and a "−" indicates an error event in which a one is detected as a zero. A "0" in an error event sequence is an indication of no change, i.e., no error at that particular bit of the error event sequence. The row labeled "time" indicates the position of each pulse with respect to the present sample time "n", which corresponds to the third "one" in the data sequence as discussed above. The second row, labeled "decisions" indicates the Viterbi decision, i.e., the value of the bit determined by the Viterbi detector, each of which may or may not be correct. Finally, the rows labeled "ERROR$_1$" through "ERROR$_8$" indicate the most likely error event sequences affecting the present sample n as determined from knowledge of errors occurring when a partial response channel is utilized.

In this example, we assume that the most frequent error event sequences ERROR$_1$ through ERROR$_8$ are the error sequences: {+}; {−}; {+−}; {−+}; {+−+}; {−+−}; {+0+}; and {−0−}. Many other error sequences are possible (e.g., {+−+−+} but these are excluded in accordance with the present invention, thereby increasing the speed of the process.

Error event likelihood ratios, expressed as "lambda values" ($\lambda_i$), are calculated for each error event i, with the more likely-occurring error event sequences having smaller lambda values and the less likely-occurring error event sequences having larger lambda values. Thus, the reliability of a bit at the time position corresponding to the present sample ("time position n") n is equal to the smallest lambda value of all error event sequences within the error event sequence. The lambda values are calculated by comparing the sequence of received samples with the various sets of sequences that would have been received if certain error event sequences were in fact present. The actual method for calculating lambda values is known; however, for the sake of clarity, following is an example of the calculation of lambda values in a typical manner. For this example, the following variables are defined as follows:

v=Viterbi data sequence e=error sequence u=alternate data sequence assuming known error event sequences occur h=partial response coefficients r=sequence obtained by product of 2v−1 and h (represents what a noiseless signal would look like if the Viterbi data sequence v was input to the channel)

w=sequence obtained by product of 2u−1 and h (represents what a noiseless signal would look like if the alternative data sequence u was input to the channel)

y=the equalized samples, i.e., the noisy output of the channel, a known quantity comprising the useful signal plus any noise on the channel $z^{(0)}$=a measure of the difference between the equalized samples y and the sequence r, obtained by taking the difference between y and r and squaring the result $z^{(1)}$=a measure of the difference between the equalized samples y and the sequence w, obtained by taking the difference between y and w and squaring the result λ=lambda value λ, obtained by taking the difference between $z^{(1)}$ and $z^{(0)}$ For this example, assume the following values shown in Table 1:

TABLE 1

| Time n | v | e | u | h | r | w | y | $z^{(0)}$ | $z^{(1)}$ | λ |
|---|---|---|---|---|---|---|---|---|---|---|
| 1 | 0 | 0 | 0 | 1 | −2 | −2 | −0.9 | 1.3 | 1.3 | 0.0 |
| 2 | 0 | 0 | 0 | 2 | −6 | −6 | −6.7 | 0.5 | 0.5 | 0.0 |
| 3 | 1 | 0 | 1 | 0 | −4 | −4 | −5.5 | 1.7 | 1.7 | 0.0 |
| 4 | 1 | 0 | 1 | −2 | 4 | 4 | 3.9 | 0.0 | 0.0 | 0.0 |
| 5 | 0 | −1 | 1 | −1 | 4 | 6 | 3.7 | 0.1 | 5.4 | 5.3 |
| 6 | 1 | 1 | 0 |  | −2 | 0 | −2.8 | 0.7 | 8.1 | 7.4 |
| 7 | 0 | −1 | 1 |  | −2 | −4 | −1.5 | 0.2 | 6.2 | 6.0 |
| 8 | 1 | 0 | 1 |  | 0 | 0 | 1.5 | 2.2 | 2.2 | 0.0 |
| 9 | 0 | 0 | 0 |  | 0 | 2 | −0.5 | 0.3 | 6.5 | 6.2 |
| 10 | 0 | 0 | 0 |  | −2 | −4 | −2.8 | 0.7 | 1.3 | 0.6 |
| 11 | 0 | 0 | 0 |  | −4 | −6 | −4.2 | 0.1 | 3.1 | 3.0 |
| 12 | 0 | 0 | 0 |  | −2 | −2 | −1.3 | 0.4 | 0.4 | 0.0 |
| 13 | 0 | 0 | 0 |  | 0 | 0 | −0.9 | 0.7 | 0.7 | 0.0 |
| 14 | 0 | 0 | 0 |  | 2 | 2 | 0.8 | 1.4 | 1.4 | 0.0 |
| 15 | 0 | 0 | 0 |  | 6 | 6 | 5.9 | 0.0 | 0.0 | 0.0 |
| 16 | 0 | 0 | 0 |  | 6 | 6 | 5.9 | 0.0 | 0.0 | 0.0 |
| 17 | 0 | 0 | 0 |  | 2 | 2 | 2.5 | 0.2 | 0.2 | 0.0 |

As an example, the second "minus 2" in the sequence r (i.e., at n=6) is obtained using the following equation, where the bracketed numbers ([ ]) indicate the time n relative to the immediately preceding variable:

$(2 \times v[2]-1) \times h[5]+$ $(2 \times v[3]-1) \times h[4]+$ $(2 \times v[4]-1) \times h[3]+$ $(2 \times v[5]-1) \times h[2]+$ $(2 \times v[6]-1) \times h[1] =$ $(-1) \times (-1) + 1 \times (-2) +$ $1 \times 0 + (-1) \times 2 + 1 \times 1 = 1 - 2 - 2 + 1 = -2$ The likelihood of the occurrence of an error event {−+−} ending at position n=7 is calculated by adding all elements of λ starting at n−[ERROR EVENT LENGTH]+1 (i.e., 7−3+1=5) and ending at n+[LENGTH OF PARTIAL RESPONSE POLYNOMIAL SEQUENCE]−1 (i.e., 7+(5−1)=11). Thus, adding all elements of λ starting at n=5 and ending at n=11, the lambda of error event −+− ending at n=7 is 5.3+7.4+6.0+0.0+6.2+0.6+3.0=28.5.

Referring back to FIG. 5, in accordance with a first embodiment of the present invention ("Embodiment 1"), from the set of error event sequences $ERROR_1$ through $ERROR_8$, a determination is made as to which of these error event sequences "end" on the present sample n. As can be seen, this forms a subset of error event sequences comprising $ERROR_1$, $ERROR_2$, $ERROR_4$, and $ERROR_7$, each of which end on the present sample n. Next, the error event likelihood ratio (the lambda values) of the error event sequences in the subset i.e., $ERROR_1$, $ERROR_2$, $ERROR_4$, and $ERROR_7$, are determined (in this example they are 7; 3; 10; and 40, respectively). Then, using the minimum lambda value (which is 3, corresponding to error event $ERROR_2$), the bit reliabilities of all bits affected by $ERROR_2$ are evaluated and, if their bit reliabilities are greater than 3, then these bit reliabilities are updated to a value of 3. In other words, in accordance with the present invention, the bit reliability of all bits affected by error event $ERROR_2$ (n and n−1, as can be seen in FIG. 5) are updated (if needed) to equal the lowest lambda value of the error event sequences of the subset, e.g., 3.

This process is repeated for each decision bit in the data sequence (i.e., as each decision bit "becomes" the present sample "n"); first the smallest lambda is calculated for the likely error event sequences in the error event list that end at the position of the present sample n, and then the bit reliability of the bits that are affected by this error event and which have a higher bit reliability than the smallest lambda value are changed to be equal to the smallest lambda value.

In a second embodiment ("Embodiment 2"), rather than determining which of the error event sequences in the above-mentioned subset has the lowest lambda value, each of the error event sequences in the subset are separately analyzed. While this takes longer time than the method described above with respect to the Embodiment 1, the result is more accurate since, for example, there may be situations where the error event having the smallest lambda does not affect a bit affected by another error event, also ending on the present bit n, that has a bit reliability that is higher than the smallest lambda. For example, referring to FIG. 5A, it can be seen that if $ERROR_7$ has a lambda value of 3 (the smallest lambda value of all error event sequences ending at the position of present sample 7), and $ERROR_4$ has a lambda value of 6. Assume further that bit n−1 of $ERROR_4$ has a bit reliability of 10.

Using the method of the first embodiment, since the n−1 position with respect to $ERROR_7$ is a 0, indicating no error, then the bit reliability of n−1, will not be changed to 3, i.e., it will remain at the higher level of 10. However, using the method of the second embodiment, since each error event is evaluated, when the process gets to the error event 4, the bit reliability of the bit at n−1 will be updated from 10 to 6.

Figure 6A:
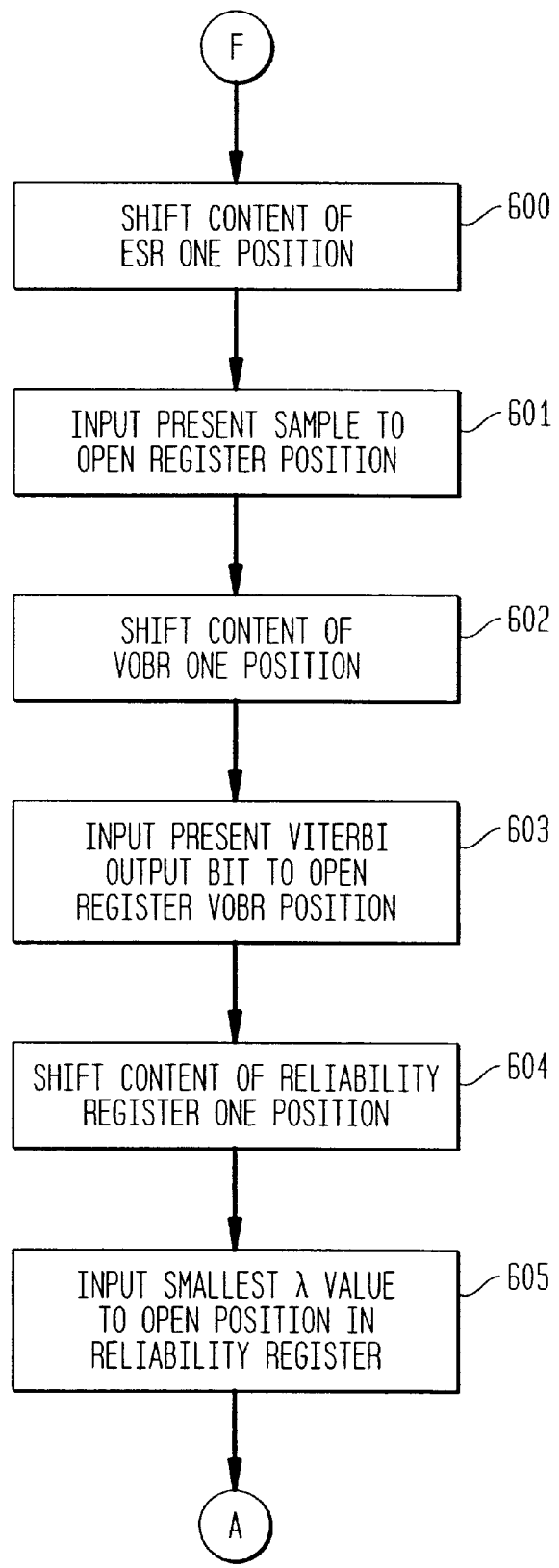
FIGS. 6 (A and B) is a flowchart illustrating the steps of a first method in accordance with the present invention.
Figure 6B:
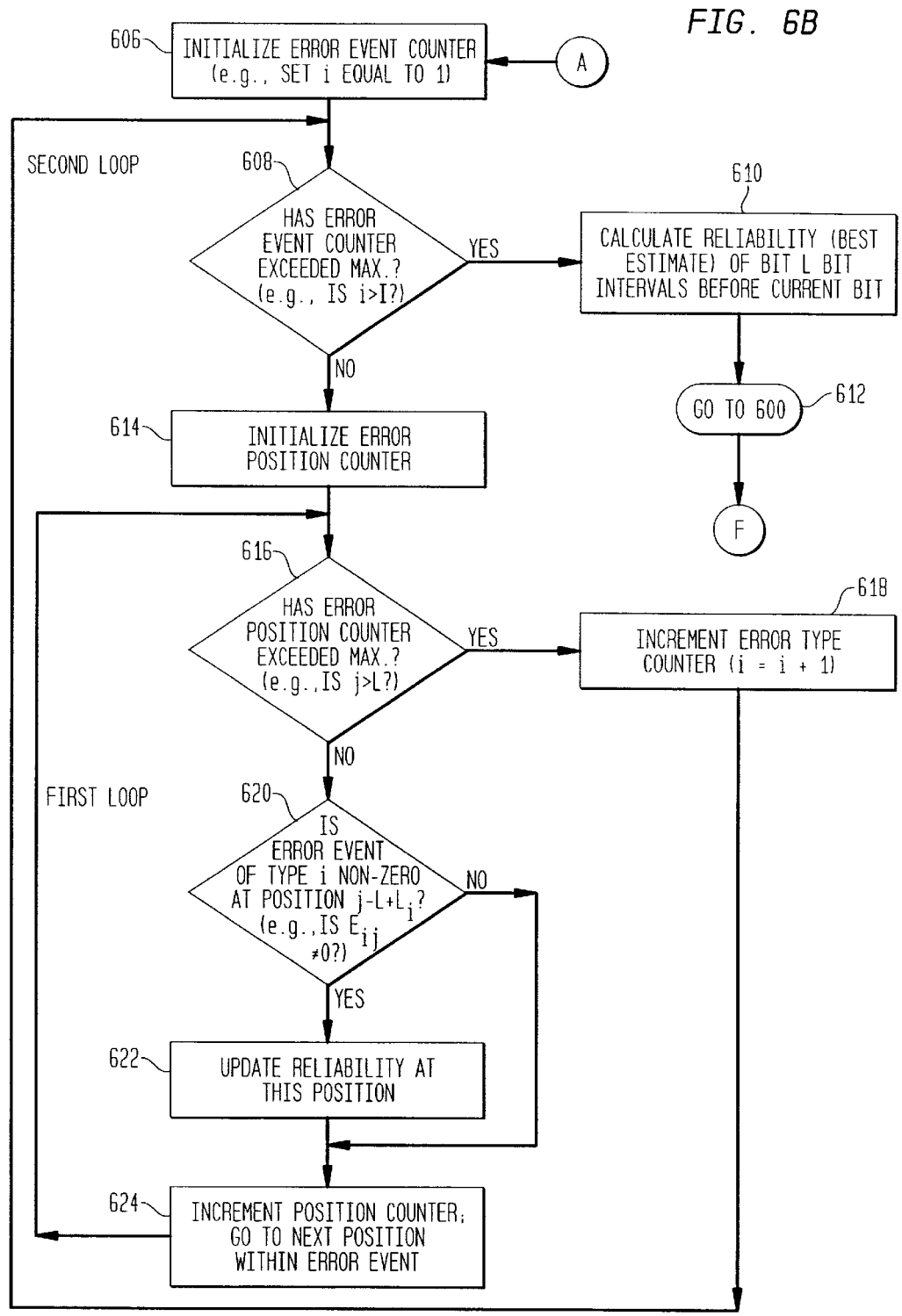

FIGS. 6A and 6B are flowcharts illustrating the operational steps of Embodiment 2 of the present invention. Beginning with FIG. 6A, at step 600 the contents of equalized sample register (ESR) is shifted one position, thereby discarding the oldest equalized sample stored therein and opening up a position for a new sample. At step 601, the present sample is input to the open register position in the ESR.

At step 602, the contents of the Viterbi output bit register (VOBR) are shifted one position, thereby discarding the oldest Viterbi output bit (decision) stored therein and opening a position for storage of the present Viterbi output bit. At step 603, the next (present) Viterbi output bit (i.e., the bit "n") is stored in the open position in the VOBR.

At step 604, the contents of the reliability register are shifted one position, thereby discarding the oldest lambda value and opening a position to receive the next lambda value. At step 605, the smallest lambda value is input to the open position in the reliability register.

Moving now to FIG. 6B, at step 606, the error event counter is initialized to assure that all elements of the error event list are considered. At step 608, a determination is made as to whether or not the error event counter has exceeded the maximum error count. If the error event counter has exceeded the maximum, then at stop 610 the updated bit reliability value is used as the output value. The process is then repeated at step 612 by returning the process to block 600 where the shifting of the contents of the registers and the inputting of new data bits begins again.

If, at step 608, it is determined that the error event counter has not exceeded the maximum, then, at step 614, the error position counter is set to the value indicating the earliest position where the error event being processed at step 608 is non-zero.

At step 616, a determination is made as to whether or not the error position counter has exceeded a maximum threshold value L. If the error position counter has exceeded the maximum threshold level, then the error-type counter is incremented and the process loops back to step 608. If, however, it is determined at step 616 that the error position counter has not exceeded the maximum threshold level L, then at step 620, a determination is made as to whether or not the error event of type i is non-0 at position $j-L+L_i$ (the variable "j" represents the starting point, i.e., the first error event from the error event list to be considered). Bit reliabilities will be updated only if the error event at this position is non-zero; if it is zero, there is no error and the accuracy of this bit is confirmed. If, at step 620, it is determined that the error event is non-0, then at step 622, the reliability at this position is updated. If, at step 620, it is determined that the error event is not non-0, then the updating step of block 622 is bypassed.

At step 624, the error position counter is incremented and then the process proceeds to the next position within the error event to again clock on the zero/non-zero status of the next position.

The process continues until the test at step 608 results in the error event counter exceeding the maximum threshold level L. At this point, the process moves to step 610 where the reliability is calculated and then the process loops back to step 600 and continues until there are no more inputs from the channel to process.

Figure 7A:
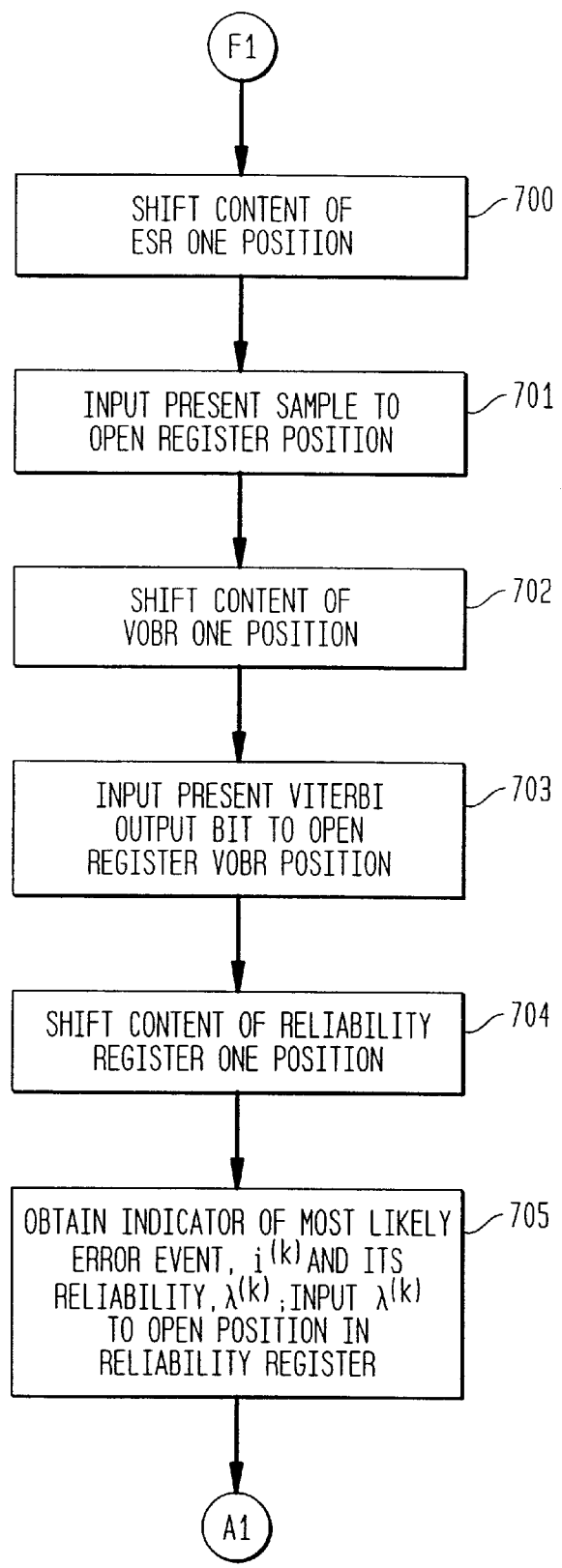
FIGS. 7 (A and B) is a flowchart illustrating a second method in accordance with the present invention.
Figure 7B:
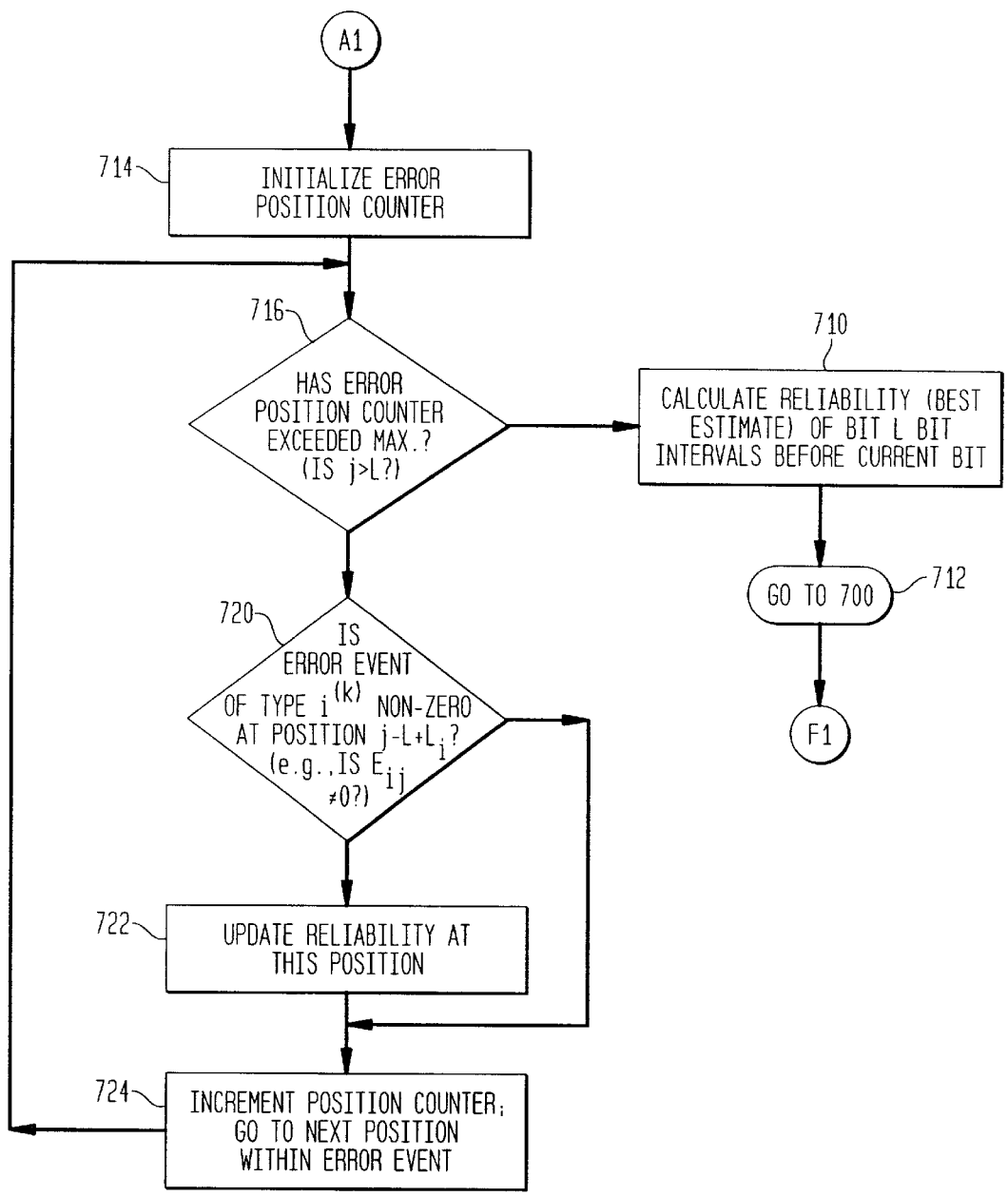

FIGS. 7A and 7B are flowcharts illustrating the operational steps of Embodiment 1 for carrying out the steps of the present invention. While less accurate than the embodiment of FIGS. 6A and 6B, the updating process is less complex. In contrast to the embodiment described with respect to FIGS. 6A and 6B which performs two sets of comparisons (each position within the error event and each error event itself), in this second embodiment, the most likely error event is determined and only this determination is used to update the bit reliabilities. This allows steps 606, 608, and 618 to be skipped as shown.

While the above description provides sufficient explanation of the process of the present invention, following is a formal description of algorithms which can be used to carry out the two embodiments (Embodiments 1 and 2) of the present invention. Assume that data and Viterbi output sequences are unipolar, i.e., $d^{(k)} \in \{0,1\}$ and $x^{(k)} \in \{0,1\}$). Let E denote set of I dominant minimum distance error event sequences: $E=\{\epsilon_i : 1 \leq i \leq I\}$, where each $\epsilon_i$ is a ternary vector of length $L_i$, $\epsilon_i=(\epsilon_{i,j})_{1 \leq j \leq L_i}, \epsilon_{i,j} \in \{-1,0,+1\}$. The maximal error event length is L. Denote by $X^{(k)}=(X_j^{(k)})_{1 \leq j \leq L}$ and $R^{(k)}=(R_j^{(k)})_{1 \leq j \leq L+L_h}$ vectors consisting of the most recent samples of sequences $x^{(k)}$ and $r^{(k)}$ (the notation in this description is such that all superscripts denote discrete time, and subscripts denote vector positions). More precisely $$Y^{(k)} = \Phi_h(X^{(k)}) = \left( \sum_{j=1}^{L_h} h_j (2 X_{i+1-j}^{(k)} - 1) \right)_{1 \leq i \leq L+L_h}$$

Note that vectors $R^{(k)}$, while containing L past samples, also contains $L_h$ future samples in order to take into account channel memory ($L_h$ is order of PR polynomial).

Denote by $E_i$ a vector of length L with the last $L_i$ components equal to $\epsilon_i$, and all other components equal to zero, i.e., $E_i=(O_{L-l_i}, \epsilon_i)$, ($O_a$ denotes a zero vector of length a). A vector $E_i$ is introduced to simplify indexing since the ends of all the error event sequences are aligned. Denote by $E^{(k)}$ set of error vectors $E_i$ that are supported by vector $X^{(k)}$, i.e., sequences $\epsilon_i$ for which $$X^{(k)} - E_i \in \{0,1\}^L.$$

If vector $X^{(k)}$ is wrong, then with high probability the correct sequence is from the set $$\{X^{(k)} - E_i : E_i \in E^{(k)}\}$$

Let $\epsilon_{i^{(k)}}$ be the sequence that caused the error. The value $i^{(k)}$, $1 \leq i^{(k)} \leq I$, is referred to as an error type or error event type at time k. By MSLD definition, if Viterbi vector $X^{(k)}$ is not correct, but the correct vector is $C^{(k)} = X^{(k)} - E_{i^{(k)}}$, then for every $i \neq i^{(k)}$ the following double inequality exists:

$$p(R^{(k)}|X^{(k)}) \geq p(R^{(k)}|C^{(k)}) \geq p(R^{(k)}|X^{(k)} - E_i^{(k)}),$$

where p( ) denotes probability density function. Under the AWGN assumption, $(p(n)=(1/\sqrt{2\pi\sigma^2}) \cdot \exp(-n^2/2\sigma^2)$, $\sigma^2$ is the noise variance, the previous relation becomes $$\|Y^{(k)} - R^{(k)}\| \leq \|Z^{(k)} - R^{(k)}\| \leq \|W^{(k)} - R^{(k)}\|$$

where $Y^{(k)}$, $Z^{(k)}$ and $W^{(k)}$ are filtered versions of vectors $X^{(k)}$, $C^{(k)}$, and $X^{(k)} - E_{i^{(k)}}, i \neq i^{(k)}$. The symbol $\|A\|$ denotes the $L_2$ norm of vector A (sum of squares of elements of A). The term "filtering" means convolving a vector by partial response polynomial h(D) (assuming initial state $S^{(k)}$ given by Viterbi output sequence $s^{(k)} = (s_j^{(k)})_{1 \leq j \leq L_h} = 2(x^{k-L-L_h+1}, \ldots, x^{(k-L)}) - 1)$. More precisely $$Y^{(k)} = \Phi_h(X^{(k)}) = \left( \sum_{j=1}^{L_h} h_j (2 X_{i+1-j}^{(k)} - 1) \right)_{1 \leq i \leq L+L_h}.$$

Expressions for the vectors $Z^{(k)}$ and $W^{(k)}$ can be obtained analogously.

Vector $C^{(k)}$ corresponds to the second best path in SOVA, and the left and central term in the above inequality correspond to SOVA's best and second best metrics. For calculating bit reliabilities or soft information the procedure from "A Viterbi Algorithm with Soft Decision Outputs and its Applications" by J. Hagenauer and D. Hoeher, Proc. GLOBECOM '89, Dallas, Tex., pp. 47.1.1–47.1.7 (November 1989) (incorporated herein by reference) can be followed. Note that the application of SOVA on $h(D)=1-D^2$ is discussed in "Producing Soft-Decision Information at the Output of a Class IV Partial Response Viterbi Detector" by K. Knudson, J. Wolf, and L. Milstein, Proc. ICC '91, pp. 26.5.1–26.5.5 (November 1991) (incorporated herein by reference). However, there are two simpler methods for calculating reliability information, described below.

If vector $X^{(k)}$ is wrong, then with high probability the correct sequence is from the set $$\{X^{(k)} - E_i^{(k)} : E_i \in E^{(k)}\}$$

where $E_i^{(k)}$ is a sequence from the error event list. If the correct sequence is not a Viterbi sequence $X^{(k)}$ but a sequence $C^{(k)} = X^{(k)} - E_{i^{(k)}}^{(k)}$, then for every $i \neq i^{(k)}$ $$p(R^{(k)}|X^{(k)}) \geq p(R^{(k)}|C^{(k)}) \geq p(R^{(k)}|X^{(k)} - E_i^{(k)}).$$

We can use quantity $p(R^{(k)}|X^{(k)}) - p(R^{(k)}|C^{(k)})$ as a reliability of our belief that sequence $X^{(k)}$ is a correct one. Due to the AWGN assumption, the likelihood calculator deals with the $L_2$ (i.e., mean square) norms. So, the logarithm of the ratio of the likelihood of Viterbi vector $X^{(k)}$ being correct versus vector $C^{(k)} = X^{(k)} - E_{i^{(k)}}^{(k)}$ can be written as $$\lambda_C^{(k)} = \|Z^{(k)} - R^{(k)}\| - \|Y^{(k)} - R^{(k)}\|$$

wherein $Y^{(k)} = \Phi_h(X^{(k)})$ denotes the vector of length $L+L_h$ obtained by filtering vector $X^{(k)}$ by PR-channel $$\Phi_h(X^{(k)}) = \left(\sum_{j=1}^{L_h} h_j(2X_{i+1-j}^{(k)} - 1)\right)_{1 \leq i \leq L+L_h}$$

where the filter initial state at time K is $$S^{(k)} = \left(S_j^{(k)}\right)_{1 \leq j \leq L_h} = 2\left(X_{j-L_h}^{(k-L)}\right)_{1 \leq j \leq L_h} - 1 = 2(x^{(k-L-L_h+j)})_{1 \leq j \leq L_h} - 1.$$

The vector $Z^{(k)} = \Phi(C^{(k)})$ is obtained by filtering vector $C^{(k)}$ assuming the same initial state.

The value $\lambda_C^{(k)}$ is also related to the likelihood of error event $E_{i^{(k)}}^{(k)}$. The smaller the value $\lambda_C^{(k)}$ is, the more likely that the error event of type $i^{(k)}$ (giving rise to $C^{(k)} = X^{(k)} - E_{i^{(k)}}^{(k)}$) has occurred. In the sequence $\lambda_C$ is sometimes referred to as to an error event likelihood or error event lambda value.

To simplify the expression $\lambda_C^{(k)}$ for "error event likelihoods", a vector $F^{(k)}$ of the most recent samples of sequence $f^{(k)}$, is utilized where $f^{(k)} = r^{(k)} - v^{(k)} = r^{(k)} * h^{(k)}$. More precisely $$F_j^{(k)} = f^{(k-L+j)}, 1 \leq j \leq L+L_h.$$

Now, to remove the norm operator:

$$\lambda_C^{(k)} = (Z^{(k)} - R^{(k)}) \cdot (Z^{(k)} - R^{(k)})^T - (Y^{(k)} - R^{(k)}) \cdot (Y^{(k)} - R^{(k)})^T$$

Define $\Delta^{(k)}$ by $\Delta^{(k)} = Y^{(k)} - Z^{(k)}$. Since $F^{(k)} = R^{(k)} - Y^{(k)}$ $$\lambda_C^{(k)} = (\Delta^{(k)} + F^{(k)}) \cdot (\Delta^{(k)} + F^{(k)})^T - F^{(k)}(F^{(k)})^T$$

which yields $$\lambda_C^{(k)} = 2\Delta^{(k)}(F^{(k)})^T + \Delta^{(k)}(\Delta^{(k)})^T$$

$$\lambda_C^{(k)} = 2 \cdot \Phi(E_{i^{(k)}}) \cdot F^{(k)T} + \Phi(E_{i^{(k)}}) \cdot \Phi(E_{i^{(k)}})^T$$

or $$\lambda_{i^{(k)}}^{(k)} = 2 \cdot \Delta_{i^{(k)}}^{(k)} \cdot F^{(k)T} + \Delta_{i^{(k)}}^{(k)} \cdot \Delta_{i^{(k)}}^{(k)T}$$

where $\Delta_i^{(k)} = 2 \cdot E_{i^{(k)}}^{(k)} * h^{(k)}$. The first part is a correlation between the filtered error event $i^{(k)}$ and the difference between the received signal and the filtered Viterbi output, and the second term is energy of the filtered error event. Each error event i at time k can be expressed as the reliability calculation "RelCal":

$$\lambda_i^{(k)} = 2 \cdot \Gamma_i^{(k)} + \Psi_i$$

where $\Gamma_i^{(k)} = 2 \cdot \Delta_i \cdot F^{(k)T}$ and $\Psi_i = \Delta_i \cdot \Delta_i^T$. Notice that filtered versions of error event sequences from a list E as well as their energies are time invariant and can be pre-calculated and stored. Notice also that although the expression for correlations $\Gamma_{i^{(k)}}^{(k)}$ is written in vector form, it is clear they can be easily converted into scalar form by using definition of inner product. Rather than parallel, the inner product of vectors can be performed serially by multiplying vector elements and adding them up. In the present case serial operations are performed on samples $f^{(k)} = r^{(k)} - x^{(k)} * h^{(k)}$.

Another important observation is that error event sequences from the list E do not satisfy the prefix condition, i.e., longer error event sequences as prefixes contain shorter error event sequences from the list. For example, from the following Table 2:

TABLE 2

Minimum Distance Error event sequences

E

| $L_i$ | $\epsilon_i$ | | | | | | | $L_i$ | $\epsilon_i$ | | | | | | |
|---|---|---|---|---|---|---|---|---|---|---|---|---|---|---|---|
| 1 | 1 | | | | | | | 1 | −1 | | | | | | |
| 3 | 1 | −1 | 1 | | | | | 3 | − | 1 | −1 | | | | |
| 5 | 1 | −1 | 1 | −1 | 1 | | | 5 | −1 | 1 | −1 | 1 | −1 | | |
| 7 | 1 | −1 | 1 | −1 | 1 | −1 | 1 | 7 | −1 | 1 | −1 | 1 | −1 | 1 | −1 |
| 3 | 1 | 0 | 1 | | | | | 3 | −1 | 0 | −1 | | | | |
| 4 | 1 | 0 | 0 | 1 | | | | 4 | −1 | 0 | 0 | −1 | | | |
| 5 | 1 | 0 | 0 | 0 | 1 | | | 5 | −1 | 0 | 0 | 0 | −1 | | |
| 5 | 1 | 0 | 1 | −1 | 1 | | | 5 | −1 | 0 | −1 | 1 | −1 | | |
| 6 | 1 | 0 | 0 | 1 | −1 | 1 | | 6 | −1 | 0 | 0 | −1 | 1 | −1 | |
| 2 | 1 | −1 | | | | | | 2 | −1 | 1 | | | | | |
| 4 | 1 | −1 | 1 | −1 | | | | 4 | −1 | 1 | −1 | 1 | | | |
| 6 | 1 | −1 | 1 | −1 | 1 | −1 | | 6 | −1 | 1 | −1 | 1 | −1 | 1 | |
| 8 | 1 | −1 | 1 | −1 | 1 | −1 | 1 | −1 | 8 | −1 | 1 | −1 | 1 | −1 | 1 | −1 | 1 | error event (+−+−+) has as a prefix (+−+), which is also an error event in the list.

In order to explain how this fact can be used to simplify calculation of $\Gamma_i^{(k)}$, consider three error event sequences: (+−+), (−) and (+−+−). The first error event is a prefix and second is a suffix or third error event. If error event (+−+−) is supported at time k, it is easy to see that (here the error event indices are replaced by error event sequences themselves)

$$\Gamma_{+-+-}^{(k)} = \Gamma_{+-+-}^{(k-1)} + \Gamma_{-}^{(k)}$$

The same conclusion holds for any prefix-suffix pair. So, a correlation between filtered error event sequences and a received signal from a previous moment can be used to calculate the correlation at present moment by adding $\Gamma_{-}^{(k)}$ or $\Gamma_{+}^{(k)}$ (these values are the same since only one of events + or − is supported). Consider an example when error event sequences contains zeros: (+−+), (+), (+−+0+). It can be seen that again first two error event sequences are prefix and suffix of third one. However, now $$\Gamma_{+-+0+}^{(k)} = \Gamma_{+-+}^{(k-2)} + \Gamma_{+}^{(k)}$$

In general, consider error event i of the form $(i_p, 00\ldots 0, i_s)$, where $i_p$ and $i_s$ are the prefix and suffix error event sequences belonging to the list. If length of $i_p$ is L−K, then $$\Gamma_i^{(k)} = \Gamma_{i_p}^{(k-K)} + \Gamma_{i_s}^{(k)}$$

Example:

Suppose that the set of error event sequences is {+,+−+,+ 00+,+−+−+}. Note that the complements of the error event sequences (i.e. {−,−+0,−00−,−+−+−}) do not need to be included since for a given Viterbi output only one combination of the signs of error sequences is possible. The simple schematic for calculating $\Gamma_i^{(k)}$ is given in FIG. 8. The delayed versions of $\Gamma_i^{(k)}$ after delay elements (labeled by D) are added to form $\Gamma_i^{(k)}$ of the longer error event.

Figure 9:
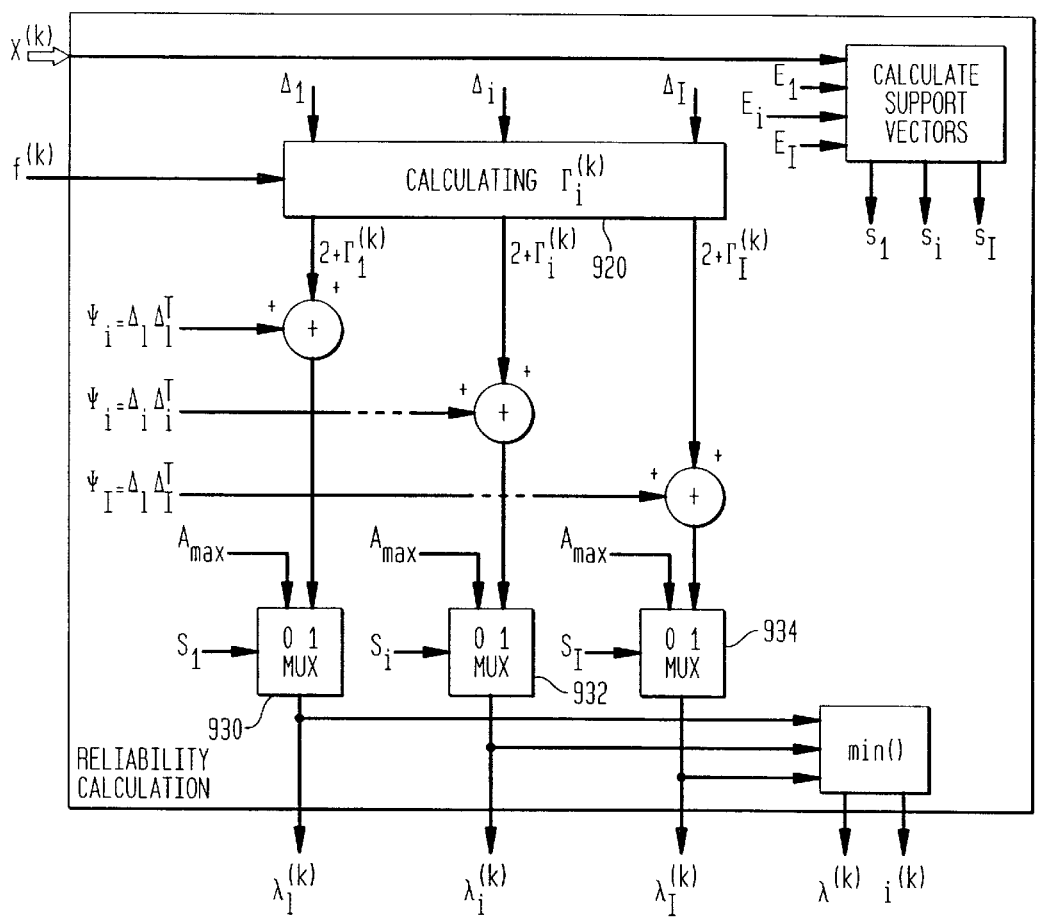
FIG. 9 illustrates a reliability calculation block in accordance with the present invention.

A Reliability Calculating block in accordance with the present invention is shown in FIG. 9. Referring to FIG. 9, at each time instant k, the inputs of the Reliability Calculation block are $X^{(k)}$ and sample $r^{(k)}$. The outputs are the likelihoods of error event sequences $\lambda_i^{(k)}, 1 \leq i \leq I$ as well as the minimum value of the likelihoods $\lambda^{(k)}$. The Reliability Calculation block consists of identical branches in which the calculations for error event sequences of types: 1,2, . . . I are performed. The Reliability Calculation block also contains a Calculate Support Vector s block, which produces the support vector $s = (s_1, \ldots, s_I)$, based on the input vector $X^{(k)}$ as well as error event sequences $E_1, \ldots, E_I$. The element $s_i$ of a support vector s is equal to one if the vector of Viterbi estimates $X^{(k)}$ supports the error event of type i, i.e. if $X^{(k)} - E_i$ is equal −1, or 0 or +1. Otherwise the $s_i = 0$.

Figure 8:
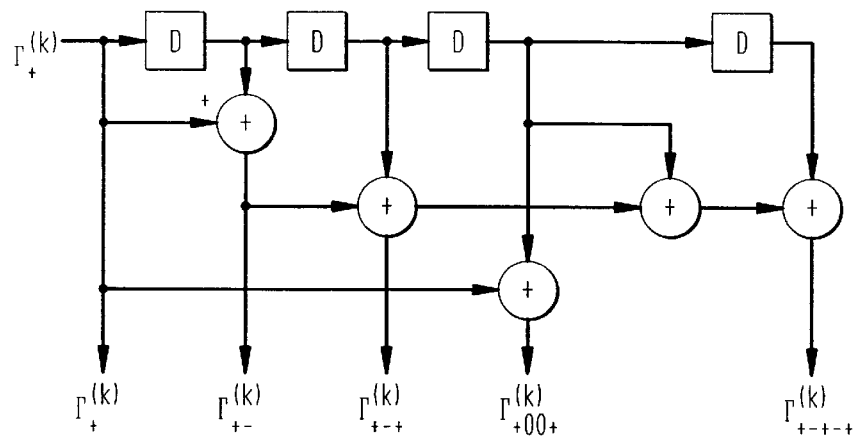
FIG. 8 is a schematic drawing illustrating an example of a method for calculating the reliability of a long error event using the reliabilities of shorter error event sequences contained therein.

The "Calculating $\Gamma_i^{(k)}$" block 920 calculates correlations as shown in FIG. 8. It accepts constant vectors of filtered error event sequences $\Delta_1, \ldots \Delta_I$, and variables $x^{(k)}$ and $r^{(k)}$ (note that these variables are scalars), and computes correlations $2\Gamma_i^{(k)}$. Each of these correlations $2\Gamma_i^{(k)}, 1 \leq i \leq I$ are subtracted from corresponding energies $\Psi_i, 1 \leq i \leq I$ by subtractors 922, 924, and 926, respectively. The results are applied to a series of multiplexers 930, 932, and 934, respectively. Each multiplexer MUX is controlled by support element $s_i$. If $s_i=1$, the output of the multiplexer will be $2\Gamma_i^{(k)} + \Psi_i^{(k)}$, otherwise the output of the multiplexer MUX will be set to some large value $A_{max}$. In this way the block min( ) will never select the value $\lambda_i^{(k)}$ as a minimal value if the error event is not supported. If error event i is supported then value $\lambda_i^{(k)}$ competes with other values in block min( ) to produce minimal value $\lambda^{(k)}$ and error responsible for it $i^{(k)}$.)

As stated above, the likelihood of error event $E_i^{(k)} = X^{(k)} - C^{(k)}$ can be calculated by using the following quantity $$\lambda_C^{(k)} = \sum_{1 \leq j \leq L+L_h} (\Phi_h(C^{(k)})_j - R_j^{(k)})^2 - \sum_{1 \leq j \leq L+L_h} (\Phi_h(X^{(k)})_j - R_j^{(k)})^2 \quad \text{(RelCal)}$$

A smaller $\lambda_c^{(k)}$ means that it is more likely that error event $E_i^{(k)}$ has occurred. Following is a description of how to use the $\lambda$ values calculated for different error event sequences to calculate bit reliabilities. In order to do this a register is needed for storing bit reliabilities. In each clock cycle the lambda values calculated for all error event sequences are used to update the content of the bit reliability register. Two methods to perform this calculation are described below.

Figure 10:
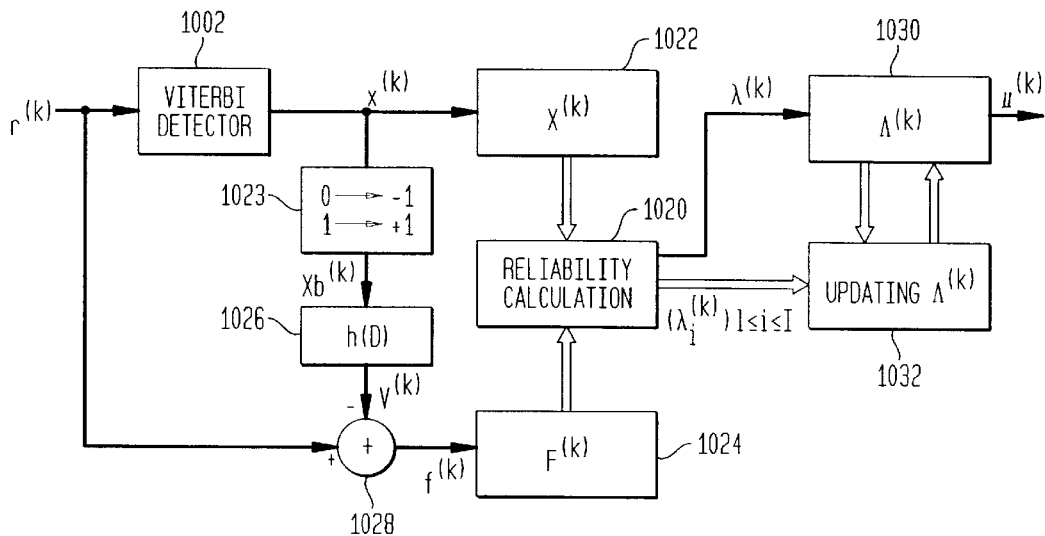
FIG. 10 illustrates an example of the basic elements of a soft output calculation block according to one embodiment of the present invention.

The first method, corresponding to Embodiment 1 discussed above with respect to FIGS. 7A and 7B, is the simpler of the two. Denote the vector of reliabilities of last L bits (at time k) by $\Lambda^{(k)} = (\Lambda_j^{(k)})_{1 \leq j \leq L} = (\lambda^{(k-L+j)})_{1 \leq j \leq L}$, and suppose that the most likely error event type at time k is $i^{(k)}$. Then reliabilities can be updated by using following rule:

Shift vector $X^{(k-1)}$:
  $X_j^{(k)} = X_{j+1}^{(k-1)}, 1 \leq j \leq L - 1$
  $X_L^{(k)} = x^{(k)}$
Shift vector $\Lambda^{(k-1)}$:
  $\Lambda_j^{(k)} = \Lambda_{j+1}^{(k-1)}, 1 \leq j \leq L - 1$
  $\Lambda_L^{(k)} = \lambda^{(k)}$
Update vector $\Lambda^{(k)}$:
  for $L - L_{i(k)} + 1 \leq j \leq L - 1$
    if $E_i \in E^{(k)}$ and $E_{i,j} \neq 0$
      $\Lambda_j^{(k)} = \min(\Lambda_j^{(k)}, \lambda^{(k)})$
    endif
  end
Generate output:
$\mu^{(k-L)} = \Lambda_1^{(k)} \cdot (2 \cdot X_1^{(k)} - 1)$ FIG. 10 shows exemplary components of the soft-output calculation block according to Embodiment 1. The reliability calculation block 1020 corresponds to FIG. 9 and calculates reliabilities for different error event sequences according to the description provided above with respect to FIG. 9. It also produces error event type $i^{(k)}$. The "updating $\Lambda^{(k)}$" block 1032 is built according to the algorithm described with respect to Embodiment 1. Notice that the bit reliabilities are generated with a delay equal to the length of the longest error event on the list.

Referring to FIG. 10, the stream of equalized samples $r^{(k)}$ is fed to the Viterbi Detector block 1002. The Viterbi Detector block 1002 produces a sequence of bit estimates $x^{(k)}$. Sequence $x^{(k)}$ is then converted from a unipolar form to a bipolar form $xb^{(k)}$ at block 1023 and is then passed through a discrete filter 1026 with polynomial h(D), to produce a sequence $v^{(k)}$, a noiseless sequence of samples that would be generated as a channel output if the Viterbi bit estimates $x^{(k)}$ were actually input to the channel (instead of the actual equalized samples $r^{(k)}$). The conversion from unipolar (binary) to bipolar form in block 1023 is necessary because the information is written as a sequence of positive and negative pulses and not as a sequence of unipolar pulses.

The functionality of a discrete filter such as filter 1026 is well known but an example of the operation of such a filter is provided for the purpose of clarity. If the polynomial h(D) is described as:

$$h(D) = h(0) + h(1) \times D^1 + h(2) \times D^2 + h(3) \times D^3 + h(4) \times D^4$$

then the sample v at time k (i.e., $v^{(k)}$ is:

$$v^{(k)} = h(0) \times xb^{(k)} \times h(1) \times xb^{(k-1)} + h(2) \times xb^{(k-2)} + h(3) \times xb^{(k-3)} + h(4) \times xb^{(k-4)}.$$

Thus, for example, if k=5, then the above equation is solved as follows:

$$v^{(5)}=h(0) \times xb^{(5)} \times h(1) \times xb^{(4)} + h(2) \times xb^{(3)} + h(3) \times xb^{(2)} + h(4) \times xb^{(1)}.$$

Sequence $r^{(k)}$ and $v^{(k)}$ are subtracted by subtractor 1028 to produce error sequence $f^{(k)}$ based on which bit reliability will be calculated. Sequences $x^{(k)}$ and $f^{(k)}$ are buffered by buffers 1022 and 1024, respectively, so that two vectors $X^{(k)}$ and $F^{(k)}$ are available all the time. These vectors are needed in subsequent calculations to check if a particular error event is supported by a data stream $x^{(k)}$. Reliability Calculation block 1020 accepts $X^{(k)}$ and $F^{(k)}$ and creates two outputs: $i^{(k)}$, which is the most likely error type at time k, and $\lambda^{(k)}$, which is the likelihood of this error type. The calculation in the Reliability Calculation block 1020 is based on the equations described above with respect to FIG. 9. Sequence $\lambda^{(k)}$ is buffered by buffer 1030 so that vector $\Lambda^{(k)}$ can be updated as explained above with respect to the Method 2 algorithm. The Updating $\Lambda^{(k)}$ block 1032 performs the updating of the bit reliabilities by assigning the likelihood $\lambda^{(k)}$ to bits that are covered by error type $i^{(k)}$ as explained with respect to the Embodiment 1 algorithm.

Note that the sign of the output $\mu^{(k)}$ is determined by the value of $x^{(k)}$, i.e. by the equation $(2 \cdot x^{(k)}-1)$. If a binary phase shift keying (BPSK) format is adopted, then the sign would be reversed.

The steps in this algorithm first compare the reliability of all supported error event sequences and find the most likely error event $i^{(k)}$, i.e., the error event with minimal $\lambda^{(k)}$. Then this value is compared with reliabilities at positions j where vector $E_{i^{(k)},j} \neq 0$, the smallest of them is chosen. Assume that the most likely error type at time k is $i^{(k)}$, which gives reliability value $\lambda^{(k)}$. If the corresponding vector $E_{i^{(k)}}$ has 1 at position j-th, and if the previously calculated reliability at this position is larger than the current reliability, then it should be updated, so that $\Lambda_j^{(k)} = \lambda^{(k)}$.

Following is an example illustrating the above-described algorithm. Suppose that the minimum distance error event list E is given in Table 3 (−1 is shortened to − and +1 to +).

TABLE 3

Example of A Short Error Event List E

| i | $L_i$ | $\epsilon_i$ |
|---|---|---|
| 1 | 1 | + |
| 2 | 1 | − |
| 3 | 3 | +−+ |
| 4 | 3 | −+− |
| 5 | 4 | +00+ |
| 6 | 4 | −00− |

Since $$L = \max_{i: \epsilon_j \in E}(L_i) = \max(1, 1, 3, 3, 4, 4) = 4,$$

we need "registers" of length 4 for vectors $X^{(k)}$ and $E_i$. Suppose that Viterbi sequence $X^{(k-1)}=(0,0,1,0)$, that the reliability vector is $\Lambda^{(k-1)}=(7.0, 6.0, 4.0, 8.0)$, that the current Viterbi output is $x^{(k)}=1$, and that the error event type that most probably causes the error at time k is $i^{(k)}=3$, with $\lambda^{(k)}=5.0$. Note that list of supported error event sequences is $E^{(k)}=\{E_1, E_3\}$. This yields the results shown in the following Table 4.

TABLE 4

| j | 1 | 2 | 3 | 4 |
|---|---|---|---|---|
| $X^{(k-1)}$ | 0 | 0 | 1 | 0 |
| $\Lambda^{(k-1)}$ | 7. | 6. | 4. | 8. |

To obtain the content of the registers at time k, the current content of the registers is first shifted to the left as shown in the following Table 5

TABLE 5

| j | 1 | 2 | 3 | 4 |
|---|---|---|---|---|
| $X^{(k)}$ | 0 | 1 | 0 | 1 |
| $\Lambda^{(k)}$ | 6. | 4. | 8. | 5. | and the values are updated. Since error vector $E_3$ is the vector with minimum reliability, positions j=2,3,4 are updated, where this vector is nonzero. Since $\Lambda_2^{(k)} < \lambda^{(k)}$ we keep value $\Lambda_2^{(k)}=4.$, but since $\Lambda^{(k)} > \lambda^{(k)}$, $\Lambda_3^{(k)}=5.$, as shown in Table 6.

TABLE 6

| j | 1 | 2 | 3 | 4 |
|---|---|---|---|---|
| $X^{(k)}$ | 0 | 1 | 0 | 1 |
| $\Lambda^{(k)}$ | 6. | 4. | 5. | 5. |
| $E_3$ | 0 | + | − | + |

The output is $\mu^{(k-4)}=(2 \cdot X_1^{(k)} - 1 * \Lambda_1^{(k)} = -0.5$. Embodiment 1 performs exactly the same calculations as those described above with respect to the example illustrated in FIG. 5. This method takes the minimum error event likelihood ratio at different points in time to calculate the bit likelihood.

Following is a discussion of a second method in accordance with the present invention corresponding to Embodiment 2 discussed above with respect to FIGS. 6A and 6B. Denote by $\lambda_j^{(k)}$ the reliabilities of all error event sequences that are supported by $X^{(k)}$ at time k, i.e. the reliabilities of error vectors from $E^{(k)}$, and denote the vector of reliabilities of last L bits by $\Lambda^{(k)}=(\Lambda_j^{(k)})_{1 \leq j \leq L}=(\lambda^{(k-L+j)})_{1 \leq j \leq L}$. Then the update rule is:

Shift vector $X^{(k-1)}$:
 $X_j^{(k)} = X_{j+1}^{(k-1)}, 1 \leq j \leq L - 1$
 $X_L^{(k)} = x^{(k)}$
Shift vector $\Lambda^{(k-1)}$:
 $\Lambda_j^{(k)} = \Lambda_{j+1}^{(k-1)}, 1 \leq j \leq L - 1$
 $\Lambda_L^{(k)} = \lambda^{(k)}$
Update vector $\Lambda^{(k)}$:
 for $E_i \in E^{(k)}$
  for $L - L_i + 1 \leq j \leq L - 1$
   if $E_{i,j} \neq 0$
    $\Lambda_j^{(k)} = \min(\Lambda_j^{(k)}, \lambda_i^{(k)})$
   endif
  end
 end
Generate output:
 $\mu^{(k-L)} = \Lambda_1^{(k)} \cdot (2 \cdot X_1^{(k)} - 1)$ Note there are two loops in Embodiment 2. This means that for each position j minimum reliabilities over reliabilities of all supported error event sequences with $E_{ij} \neq 0$ must be found and then compared with the reliability $\Lambda_j^{(k)}$ at position j.

Again, the sign of the output $\mu^{(k)}$ is determined by the value of $x^{(k)}$. A block diagram of a soft-output calculation block according to Embodiment 2 is shown in FIG. 11.

Figure 11:
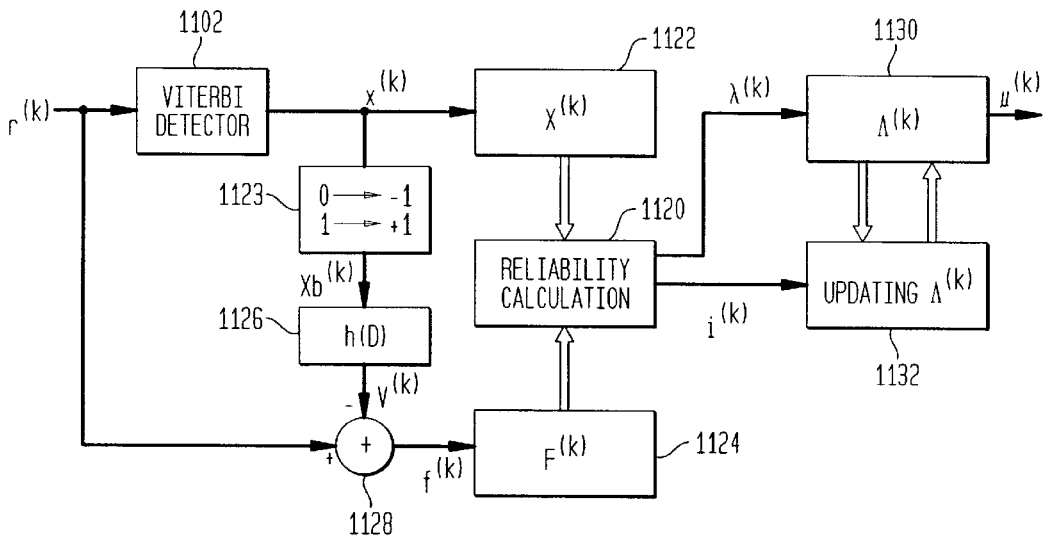
FIG. 11 illustrates a block diagram of a soft output calculation block in accordance with the second embodiment of the present invention.

Referring to FIG. 11, the stream of equalized samples $r^{(k)}$ is fed to the Viterbi Detector block 1102. The Viterbi Detector block 1102 produces a sequence of bit estimates $x^{(k)}$. Sequence $x^{(k)}$ is passed through a discrete filter 1126 with a polynomial h(D), thus producing sequence $v^{(k)}$. Sequence $r^{(k)}$ and $v^{(k)}$ are subtracted by subtractor 1128 to produce sequence $f^{(k)}$. Sequences $x^{(k)}$ and $f^{(k)}$ are buffered by buffers 1122 and 1124, respectively, so that two vectors $X^{(k)}$ and $F^{(k)}$ are available at all times. The Reliability Calculation block 1120 accepts $X^{(k)}$ and $R^{(k)}$ and creates two outputs: the first one is a vector output with elements equal to the likelihoods of error event sequences ($\lambda_i^{(k)}$), and the second one ($\lambda_{(k)}$) is the likelihood of the most likely error type at time k. The calculation in the Reliability Calculation block 1120 is based on equation (RelCal) described previously herein. Sequence $\lambda^{(k)}$ is buffered by buffer 1130 so that vector $\Lambda^{(k)}$ can be updated as explained in connection with the Method 1 algorithm. The Updating $\Lambda^{(k)}$ block 1132 performs the updating of the bit likelihoods as explained in connection with the Method 1 algorithm.

Following is an example of an application of the Embodiment 2 algorithm. Suppose that the minimum distance error event list E is given in Table 7.

TABLE 7

Example of A Short Error Event List E

| i | $L_i$ | $\epsilon_i$ |
|---|---|---|
| 1 | 1 | + |
| 2 | 1 | − |
| 3 | 3 | +−+ |
| 4 | 3 | −+− |
| 5 | 4 | +00+ |
| 6 | 4 | −00− |
| 7 | 2 | −+ |
| 8 | 2 | +− |

Since $$L = \max_{i: \epsilon j \in E}(L_i) = \max(1, 1, 3, 3, 4, 4, 2, 2) = 4,$$

"registers" of length 4 are needed for vectors $\Lambda^{(k)}$ and $E_i$. Assume: Viterbi sequence $X^{(k-1)}=(0,1,0,0)$, the reliability vector $\Lambda^{(k-1)}=(2.0, 7.0, 9.0, 8.0)$, and the current Viterbi output $x^{(k)}=1$. For k−1, the values illustrated in the following Table 8 are obtained:

TABLE 8

| j | 1 | 2 | 3 | 4 |
|---|---|---|---|---|
| $X^{(k-1)}$ | 0 | 1 | 0 | 0 |
| $\Lambda^{(k-1)}$ | 2. | 7. | 9. | 8. |

After shifting, $X^{(k)}=(1,0,0,1)$. The set of supported error vectors is $E^{(k)}=\{E_1, E_5, E_7\}$. Suppose that for these events the following lambdas exist: $\lambda_1^{(k)}=2.0, \lambda_5^{(k)}=5.0, \lambda_7^{(k)}=3.0$. Then we obtain the values illustrated in the following Table 9 are obtained:

TABLE 9

| j | 1 | 2 | 3 | 4 | |
|---|---|---|---|---|---|
| $X^{(k)}$ | 1 | 0 | 0 | 1 | |
| $\Lambda^{(k)}$ | 7. | 9. | 8. | | |

TABLE 9-continued

| j | 1 | 2 | 3 | 4 | |
|---|---|---|---|---|---|
| $E_3$ | 0 | + | − | + | $\lambda_1^{(k)} = 2.$ |
| $E_5$ | + | 0 | 0 | + | $\lambda_5^{(k)} = 5.$ |
| $E_7$ | 0 | 0 | − | + | $\lambda_7^{(k)} = 3.$ |

Now, the following applies:

$\Lambda_4^{(k)}=\min(\lambda_1^{(k)},\lambda_5^{(k)},\lambda_7^{(k)})=\min(2.,5.,3.)=2$ $\Lambda_3^{(j)}=\min(\Lambda_3^{(k)},\lambda_7^{(k)})=3.$ $\Lambda_3^{(k)}=\Lambda_3^{(j)}=9.$ $\Lambda_3^{(k)}=\min(\Lambda_3^{(k)},\lambda_5^{(k)})=5.$ The final state of the registers at time k is as shown in the following Table 10

TABLE 10

| j | 1 | 2 | 3 | 4 |
|---|---|---|---|---|
| $X^{(k-1)}$ | 1 | 0 | 0 | 1 |
| $\Lambda^{(k-1)}$ | 5. | 9. | 3. | 2. | and the output is $\mu^{(k-4)}=(2 \cdot X_1^{(k)}-1)*\Lambda_1^{(k)}=+05$.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

What is claimed is:

1. A method of extracting reliability information for a bit of interest in a group of bits comprising a data sequence on a partial response channel, comprising the steps of:

calculating error event likelihood values with respect to said data sequence; and deriving a bit likelihood ratio for the bit of interest from said error event likelihood values.

2. A method of extracting reliability information for a bit of interest in a group of bits comprising a data sequence on a partial response channel, comprising the steps of:

calculating error event likelihood values with respect to said data sequence, said calculating step comprising at least the steps of compiling a first error event set comprising error event sequences;

selecting, from said first error event set, a second error event set comprising error event sequences which affect the bit of interest; and determining the error event likelihood value of each error event sequence of said second error event set; and deriving a bit likelihood ratio for the bit of interest from said error event likelihood values.

3. A method as set forth in claim 2, wherein said deriving step comprises at least the steps of:

determining which of the error event likelihood values indicates an error event sequence having the highest probability of occurring; and assigning to the bit of interest a bit likelihood value corresponding to the error event likelihood value for the error event determined to have the highest probability of occurring.

4. A method as set forth in claim 3, wherein said assigned bit likelihood value is equal to the error event likelihood value for the error event determined to have the highest probability of occurring.

5. A method as set forth in claim 4, wherein said calculating and deriving steps are repeated until all of the bits of said group comprising the data sequence have been considered as the bit of interest.

6. A method as set forth in claim 5, wherein the sign (+or −) of said assigned bit likelihood value is determined by the value of the bit of interest.

7. A method as set forth in claim 6, wherein if the bit of interest is a 1, then the sign of the assigned bit likelihood value is positive.

8. A method as set forth in claim 6, wherein if the bit of interest is a 1, then the is sign of the assigned bit likelihood value is negative.

9. A method as set forth in claim 3, wherein said first error event set comprises only error event sequences that occur at least 50% of the time.

10. A method as set forth in claim 3, wherein said first error event set comprises only error event sequences that occur at least 75% of the time.

11. A method as set forth in claim 2, wherein said error event sequences each comprise one or more error event bits, with each error event bit having a bit likelihood value, and further comprising the steps of:

determining the bit likelihood value of each error event bit associated with a particular error event sequence in said second error event set; and changing the bit likelihood value of each error event bit having a bit likelihood value greater than the error event likelihood value of its associated error event sequence, to equal the error event likelihood value of its associated error event sequence.

12. A method as set forth in claim 11, wherein said calculating, deriving, determining, and changing steps are repeated until all of the bits of said group comprising the data sequence have been considered as the bit of interest.

13. A method as set forth in claim 12, wherein said first error event set comprises only error event sequences that occur at least 75% of the time.

14. A method as set forth in claim 11, wherein said first error event set comprises only error event sequences that occur at least 50% of the time.

15. A device for extracting reliability information for a bit of interest in a group of bits comprising a data sequence on a partial response channel, comprising:

an error event likelihood calculator calculating error event likelihood values with respect to said data sequence; and a bit likelihood ratio calculator deriving a bit likelihood ratio for the bit of interest from said error event likelihood values.

16. A device for extracting reliability information for a bit of interest in a group of bits comprising a data sequence on a partial response channel, comprising:

an error event likelihood calculator calculating error event likelihood values with respect to said data sequence, comprising:

an error event set compiler compiling a first error event set comprising error event sequences;

an error event set selector selecting, from said first error event set, a second error event set comprising, error event sequences which affect the bit of interest; and determination means of determining the error event likelihood value of each error event sequence of said second error event set; and a bit likelihood ratio calculator deriving a bit likelihood ratio for the bit of interest from said error event likelihood values.

17. A device as set forth in claim 16, wherein said bit likelihood ratio calculator comprises:

determination means for determining which of the error event likelihood values indicates an error event sequence having the highest probability of occurring; and assigning means for assigning to the bit of interest a bit likelihood value corresponding to the error event likelihood value for the error event determined to have the highest probability of occurring.

18. A device as set forth in claim 17, wherein said assigning means assigns to the bit of interest a bit likelihood value which is equal to the error event likelihood value for the error event determined to have the highest probability of occurring.

19. A device as set forth in claim 16, wherein said error event sequences each comprise one or more error event bits, with each error event bit having a bit likelihood value, flier comprising:

means for determining the bit likelihood value of each error event bit associated with a particular error event sequence in said second error event set; and means for changing the bit likelihood value of each error event bit having a bit likelihood value greater than the error event likelihood value of its associated error event sequence, to equal the error event likelihood value of its associated error event sequence.

* * * * *